United States Patent [19]
Dufossez

[11] Patent Number: 6,137,362
[45] Date of Patent: Oct. 24, 2000

[54] LOW NOISE AND HIGH INPUT DYNAMIC RANGE DIFFERENTIAL AMPLIFIER STAGE

[75] Inventor: Vincent Dufossez, Grenoble, France

[73] Assignee: SGS-Thomson Microelectronics S.A., Gentilly, France

[21] Appl. No.: 09/049,774

[22] Filed: Mar. 27, 1998

[30] Foreign Application Priority Data

Mar. 28, 1997 [FR] France ................................. 97 04095

[51] Int. Cl.[7] ........................................................ H03F 3/45
[52] U.S. Cl. ............................ 330/254; 330/258; 330/261; 330/9
[58] Field of Search ................................ 330/9, 252, 254, 330/258, 261

[56] References Cited

U.S. PATENT DOCUMENTS

| | | | |
|---|---|---|---|
| 4,612,513 | 9/1986 | Seevinck | 330/261 |
| 4,723,110 | 2/1988 | Voorman | 330/252 |
| 4,951,003 | 8/1990 | De Jager et al. | 330/252 |
| 5,317,279 | 5/1994 | Zarabadi et al. | 330/253 |
| 5,406,221 | 4/1995 | Samani et al. | 330/254 |
| 5,815,039 | 9/1998 | Kimura | 330/252 |

OTHER PUBLICATIONS

French Search Report from French Patent Application 97 04095, filed Mar. 28, 1997.

J. Addis: "Versatile Analogue Chip For Oscilloscope Plug–Ins Part 1", Electronic Engineering, vol. 60, No. 760, Aug. 1988, London GB, pp. 23–28.

Primary Examiner—Michael Shingleton
Attorney, Agent, or Firm—Wolf, Greenfield & Sacks, P.C.; James H. Morris; Theodore E. Galanthay

[57] ABSTRACT

The present invention relates to a differential stage including two first transistors respectively controlled by two components of a differential input voltage, these transistors being connected to a common current source and forming two differential output branches. The stage includes an auxiliary transistor controlled by the common mode of the differential input voltage and connected to take from each of the output branches a portion of the current established by the common current source.

35 Claims, 1 Drawing Sheet

LOW NOISE AND HIGH INPUT DYNAMIC RANGE DIFFERENTIAL AMPLIFIER STAGE

BACKGROUND OF THE INVENTION

1. Field of the Invention

The present invention relates to a variable gain amplifier and more generally to a differential amplifier stage with high input dynamics.

2. Discussion of the Related Art

A conventional differential amplifier stage generally includes two transistors, the emitters (or sources) of which are directly connected to one another and biased by a common current source. It has the advantage of having a high gain and a low noise. However, it has low input dynamic range, that is, it saturates for a particularly low differential input voltage (a few millivolts).

If higher differential voltages are desired to be applied to a differential amplifier stage, the stage is degraded by the insertion of emitter (or source) resistors. A differential stage with a low gain and high noise due to the presence of the emitter resistors in the signal path is thus obtained.

Using a differential stage, a variable-gain amplifier is easily formed. For this purpose, it is enough to adjust the gain via the biasing current of the emitters. In the case of bipolar transistors, the gain varies proportionally to the biasing current.

In most cases where it is desired to use a variable-gain amplifier, the input voltage is likely to vary within a wide range. For low signal levels, the gain is high, while the gain is low for high signal levels, this in order to provide an output signal having substantially constant amplitude.

Then, since the differential stage is likely to receive input voltages of high amplitude, this differential stage is generally of the type including emitter resistors. If the emitter resistances are fixed, the gain obtained for low level voltages is particularly low and requires the use of an additional gain stage. Further, the stage noise, particularly disturbing at low signal levels, is increased by the emitter resistors.

FIG. 1 shows a conventional variable-gain stage which has a particularly high gain for low level signals, while having high input dynamic range.

This stage includes two NPN-type bipolar transistors Q1 and Q2, the bases of which are respectively controlled by the components (V1 and V2) of a differential input voltage. The output signal of the stage is taken between the collectors of transistors Q1 and Q2, which are further connected to a high supply potential Vcc via respective resistors 10 and 11.

The emitters of transistors Q1 and Q2 are interconnected via a chain of resistors 13a to 13f connected in series. Each connection node between two successive resistors 13 is connected to a common current source 15 via a diode D. Current source 15 is further connected to a low supply potential, such as ground GND. The connection node between resistors 13c and 13d is connected to potential Vcc by a resistor 17.

The gain of this stage is adjusted via current source 15, as with a conventional stage. If the current of source 15 is low, this current preferentially passes through resistors 13, whereby transistors Q1 and Q2 see a high impedance between their emitters. Thus, the stage gain is made low by both the low biasing current of source 15 and the high emitter impedance.

If the current of source 15 increases, this current tends to preferentially pass through diodes D, which have low impedances. When the current of source 15 reaches a determined threshold, this current only passes through the chain end diodes D and through resistors 13a and 13f. Thus, the impedance seen by transistors Q1 and Q2 between their emitters is minimum. The stage gain is then high since the biasing current is high and the emitter impedances are minimum.

However, the stage of FIG. 1 exhibits a high noise for low gains due to the presence of a high emitter impedance. Further, since diodes D are non-linear elements which are placed on the path of the input signal, the stage introduces a high distortion.

SUMMARY OF THE INVENTION

An object of the present invention is to provide a differential stage having high dynamic range, while having a high gain, low noise, and a low distortion.

This and other objects are achieved according to the present invention by means of a differential stage including two first transistors respectively controlled by two components of a differential input voltage, these transistors being connected to a common current source and forming two differential output branches. The stage includes an auxiliary transistor controlled by the common mode of the differential input voltage and connected to take from each of the output branches a portion of the current established by the common current source.

According to an embodiment of the present invention, the auxiliary transistor has a higher transconductance than that of the first transistors.

According to an embodiment of the present invention, the transconductance of the auxiliary transistor is selected so that the gain of the differential stage is maintained when the differential input voltage exceeds a threshold where one of the first transistors turns off.

According to an embodiment of the present invention, the transconductance of the auxiliary transistor is 5 to 6 times as high as that of the first transistors.

According to an embodiment of the present invention, the auxiliary transistor is connected between the common current source and the midpoint of a dividing bridge (voltage divider) connected between the two output branches, and is controlled by the midpoint of a second dividing bridge (voltage divider) across which the differential input voltage is applied.

According to an embodiment of the present invention, the transconductance of the auxiliary transistor is adjusted by a signal applied on the midpoint of the second dividing bridge.

The present invention also provides a variable-gain amplifier including a differential stage of the above-mentioned type, and means for modifying the gain by adjusting the current of the common current source.

According to an embodiment of the present invention, the variable-gain amplifier includes means for varying the transconductance of the auxiliary transistor conversely to the gain variation of the stage.

The foregoing as well as other objects, features, and advantages of the present invention will be discussed in detail in the following non-limiting description of specific embodiments in connection with the accompanying drawings.

DETAILED DESCRIPTION

Figure 1:
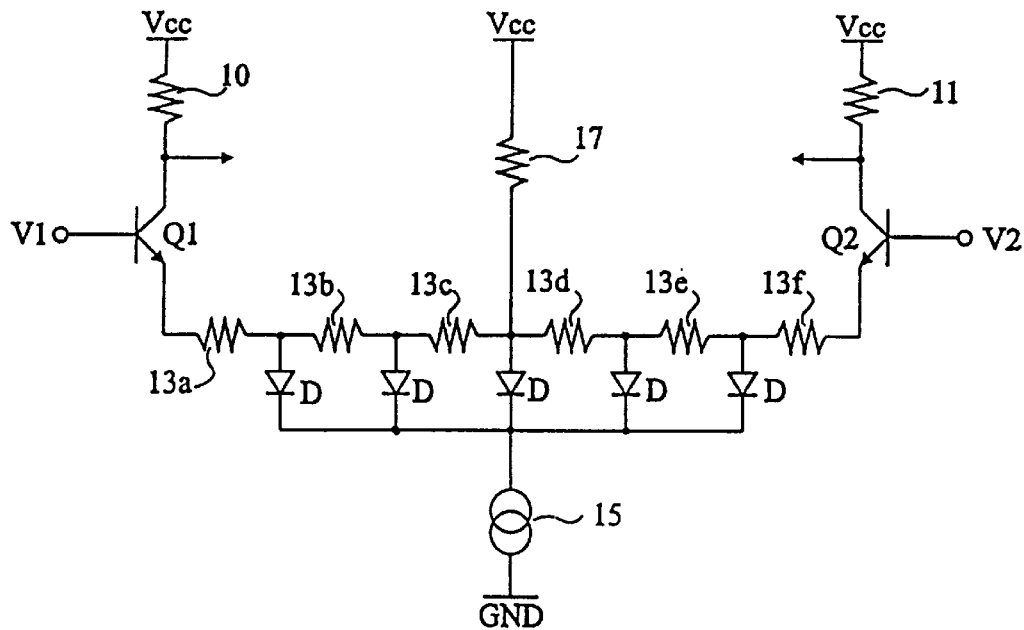
FIG. 1, previously described, shows a conventional variable-gain and high input dynamics differential stage.
Figure 2:
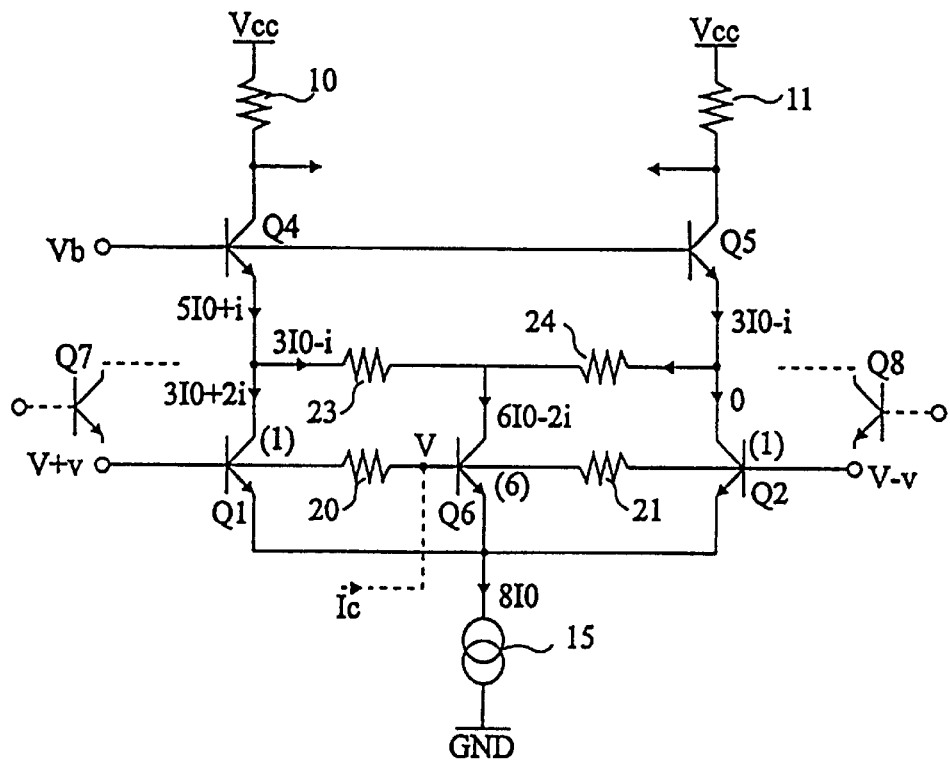
FIG. 2 shows an embodiment of a differential stage according to the present invention.

In FIG. 2, elements similar to those of FIG. 1 are designated by same references. Thus, the differential stage of FIG. 2 includes two transistors Q1 and Q2, for example, of bipolar NPN-type, the collectors of which are coupled to high supply potential Vcc via respective load resistors 10 and 11. The emitters of transistors Q1 and Q2 are directly interconnected, that is, without emitter resistors, and biased by a current source 15 connected to ground GND. The bases of transistors Q1 and Q2 receive the respective components V+v and V-v of a differential input voltage.

Preferably, the collectors of transistors Q1 and Q2 are connected to resistors 10 and 11 via respective cascode transistors Q4 and Q5. The collectors of transistors Q1 and Q2 are connected to the emitters of transistors Q4 and Q5, while the collectors of transistors Q4 and Q5, between which the differential output of the stage is taken, are connected to resistors 10 and 11. The bases of transistors Q4 and Q5 are biased by the same fixed voltage Vb comprised between the maximum value of the input voltages and potential Vcc.

The differential stage described up to now is totally conventional and is of the high gain and low noise type, due to the absence of emitter resistors. The elements not yet described allow, according to the present invention, considerably extending the input dynamic range of the stage without any significant prejudice to its characteristics, especially without introducing any noise or distortion.

According to the present invention, an auxiliary transistor Q6, of type NPN in this example, is directly connected by its emitter to the emitters of transistors Q1 and Q2. It receives on its base the common mode voltage V of the components of the differential input voltage. For this purpose, the base of transistor Q6 can be connected to the midpoint of a bridge of two resistors 20 and 21 of same value, connected between the bases of transistors Q1 and Q2. Further, the collector of transistor Q6 is connected to take current from the collectors of transistors Q1 and Q2. For this purpose, it can be connected to the midpoint of a bridge of two resistors of the same value 23 and 24, interconnected between the collectors of transistors Q1 and Q2.

For reasons which will become apparent hereafter, the emitter surface of transistor Q6 is higher than that of transistors Q1 and Q2. The normalized emitter surfaces of these transistors are indicated between parenthesis in FIG. 2. Thus, for example, transistors Q1 and Q2 have a normalized surface of 1 while transistor Q6 has a normalized surface of 6.

The differential stage of FIG. 2 has two operating ranges.

In a first range, differential input voltage 2v is of low level (a few millivolts). Transistor Q6 does not intervene and the operation is that of a conventional differential stage.

The current values indicated in FIG. 2 are not those corresponding to the first operating range.

At rest (2v=0), the base voltages of transistors Q1 and Q2 are equal to their common mode value V. The base voltage of transistor Q6 is also equal to V.

The collector currents of transistors Q1 and Q2 are equal to IO, while the collector current of transistor Q6 is equal to 6IO, since the emitter surface of transistor Q6 is six times as high as that of transistors Q1 and Q2. Thus, current source 15 pulls a current 8IO.

The emitter voltages of cascode transistors Q4 and Q5 being equal, the collector current 6IO of transistor Q6 distributes in a balanced way between resistors 23 and 24. Thus, each of resistors 23 and 24 carries a current 3IO, and the currents through transistors Q4 and Q5, and thus through the output branches of the stage, settle to 4IO.

When differential input voltage 2v increases, the collector currents of transistors Q1 and Q2 settle to IO+i and IO-i, where i is a current lower than IO and equal to the product of the stage transconductance by value v. The collector current of transistor Q6 remains equal to 6IO and always distributes in a balanced way between resistors 23 and 24, since the emitter voltages of transistors Q4 and Q5 remain substantially equal. Thus, the currents in transistors Q4 and Q5, and thus the currents in resistors 10 and 11, settle on 4IO+i and 4IO-i. The differential output voltage taken between the collectors of transistors Q4 and Q5 is thus proportional to i.

In this first operating range, the stage gain is proportional to the sum of the quiescent currents of transistors Q1 and Q2, that is, 2IO.

If voltage v keeps on increasing, there comes a point when current i is equal to IO, whereby the collector current of transistor Q2 becomes zero. This point corresponds to the saturation of a conventional differential stage and to the beginning of the second operating phase of the stage according to the present invention.

However, when the stage according to the present invention reaches this point, transistor Q6 still takes a current 3IO from each of the emitters of transistors Q4 and Q5. The collector current of transistor Q2 being zero, the emitter current of transistor Q5 is equal to zip. The collector current of transistor Q1 being equal to 2IO, the emitter current of transistor Q4 is equal to 5IO.

If voltage v keeps on increasing, transistor Q6 takes over on transistor Q2, definitively off, and reacts to the variations of differential input voltage 2v. Transistors Q1 and Q6 form a new specific differential stage which receives the half v of the differential input voltage due to resistor bridge 20, 21. Further, it divides by 2 the differential current through the output branches since the collector current of transistor Q6 is always distributed in a balanced way between resistors 23 and 24. Indeed, a first half of the component of the differential current -2i appearing in the collector of transistor Q6 forms component -i of the output branch containing resistor 11, but the second half decreases component 2i created by transistor Q1 in the other output branch.

Concretely, as indicated in FIG. 2, the collector current of transistor Q1 settles on 2IO+2i and the collector current of transistor Q6 settles on 6IO-2i. The current in each of resistors 23 and 24 is equal to 3IO-i and the currents in transistors Q4 and Q5, and thus in the output branches, settle on 5IO+i and 3IO-i.

The general stage gain seems to be divided by 4 with respect to the stage gain in the first operating range. Actually, the sum of the quiescent currents of transistors Q1 and Q6 (8IO) is four times higher than the sum of the quiescent currents of transistors Q1 and Q2 in the first operating range, which increases the transconductance by a factor 4. Thus, the general gain of the differential stage theoretically remains constant over both operating ranges.

Voltage v can keep on increasing until the current of transistor Q6 becomes zero and all the current of source 15 passes through transistor Q1.

The dynamics thus obtained by means of a stage according to the present invention are next to ten times as high as those of a conventional stage without emitter resistors. The dynamics can be further extended by increasing the emitter surface of transistor Q6. However, the stage gain is then not constant over the entire input dynamic range.

In reality, the switching from the first operating range to the second one is not abrupt and is performed progressively before the turning off of transistor Q2. This causes a local increase of the gain which affects the linearity of the stage response. In the second range, the current of transistor Q2 tends to zero without becoming zero.

To take into account this operation and improve the linearity, the normalized emitter surface of transistor Q6 is preferably close to 5 and not to 6.

According to an alternative, the emitter surface of transistor Q6 is chosen to be equal to that of transistors Q1 and Q2 and its transconductance is increased to the desired value, as shown in dotted lines, by injecting a control current Ic at its base.

Due to the presence of resistors 20 and 21 between the bases of transistors Q1 and Q2, the stage exhibits a low input impedance. In the cases where this would be disturbing, Darlington assemblies including transistors Q7 and Q8 connected between the collectors and the bases of transistors Q1 and Q2 and controlled by the differential input signal are provided, as is shown.

A differential stage according to the present invention can advantageously be used in a variable-gain amplifier. As in a conventional differential stage, it is enough to modify the current of source 15 to adjust the gain. Thus, the differential stage has a high maximum gain and, for the entire range of gain settings, a low noise and a low distortion.

In an advantageous alternative variable-gain amplifier according to the present invention, the emitter surface of transistor Q6 is equal to that of transistors Q1 and Q2 and control current Ic of transistor Q6 varies conversely to the gain variation of the stage. Thus, when the stage gain is maximum, the current of transistor Q6 is minimum. This is not disturbing, since the maximum gain setting generally corresponds to a low level input signal which does not risk causing stage saturation. Only for low gains is there a risk that the input signal will be at a high level and require the increased dynamic range provided by transistor Q6.

This solution reduces, in particular, the current consumption of the differential stage, all the more as the high gains are obtained for the highest currents of source 15.

The variations of control current Ic of transistor Q6 can be linear, stepped, or abrupt at the switching between the two operating ranges.

Of course, the present invention is likely to have various alterations, modifications, and improvements which will readily occur to those skilled in the art. For example, cascode transistors Q4 and Q5 can be omitted. Then, the current of transistor Q6 does not distribute in a balanced way between resistors 23 and 24, but this does not significantly affect the stage operation. The bipolar transistors can be replaced by MOS transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A differential stage including two first transistors respectively controlled by two components of a differential input voltage, the two first transistors being connected to a common current source and forming two differential output branches, including an auxiliary transistor controlled by the common mode of the differential input voltage and connected to take from each of the output branches a portion of the current established by the common current source;
   wherein the auxiliary transistor is connected between the common current source and the midpoint of a dividing bridge connected between the two output branches, and is controlled by the midpoint of a second dividing bridge across which the differential input voltage is applied.

2. The differential stage of claim 1, wherein the auxiliary transistor has a higher transconductance than that of the first transistors.

3. The differential stage of claim 2, wherein the transconductance of the auxiliary transistor is selected so that a gain of the differential stage is kept when the differential input voltage exceeds a threshold where one of the first transistors turns off.

4. The differential stage of claim 3, wherein the transconductance of the auxiliary transistor is 5 to 6 times as high as that of the first transistors.

5. A differential stage comprising:
   a pair of differential input terminals;
   a pair of first transistors coupled respectively from said pair of differential input terminals and respectively controlled by two components of a differential input voltage applied at said differential input terminals;
   a current source commonly connected to said pair of first transistors;
   two differential output branches associated respectively with said pair of first transistors; an auxiliary transistor controlled by the common mode of the differential input voltage and constructed and arranged to take from each of the output branches a portion of the current established by the common current source;
   further including a dividing bridge connected between the two output branches.

6. The differential stage of claim 1, wherein the transconductance of the auxiliary transistor is adjusted by a signal applied on the midpoint of the second dividing bridge.

7. A variable-gain amplifier including the differential stage of claim 1, and further comprising means for modifying the gain by adjusting the current of the common current source.

8. A variable-gain amplifier including the differential stage of claim 6, and further comprising means for modifying the gain by setting the common current source, and means for varying the transconductance of the auxiliary transistor conversely to the gain variation of the stage.

9. The differential stage according to claim 5 wherein the auxiliary transistor has a higher transconductance than that of the first transistors.

10. The differential stage of claim 9, wherein the transconductance of the auxiliary transistor is selected so that a gain of the differential stage is kept when the differential input voltage exceeds a threshold where one of the first transistors turns off.

11. The differential stage of claim 10, wherein the transconductance of the auxiliary transistor is 5 to 6 time as high as that of the first transistors.

12. A differential stage comprising:
   a pair of differential input terminals;
   a pair of first transistors coupled respectively from said pair of differential input terminals and respectively controlled by two components of a differential input voltage applied at said differential input terminals;

a current source commonly connected to said pair of first transistors;

two differential output branches associated respectively with said pair of first transistors; an additional transistor means controlled by the common mode of the differential input voltage and constructed and arranged to take from each of the output branches a portion of the current established by the common current source;

further including a first dividing bridge means connected between the output branches and wherein the additional transistor means is connected between the common current source and the midpoint of the first dividing bridge means.

13. The differential stage of claim 5 wherein the auxiliary transistor is connected between the common current source and the mid-point of the dividing bridge.

14. The differential stage of claim 13 wherein said dividing bridge comprises a first pair of resistors.

15. The differential stage of claim 14 further including a second dividing bridge across which the differential input voltage is applied.

16. The differential stage of claim 15 wherein the auxiliary transistor is controlled from the mid-point of the second dividing bridge.

17. The differential stage of claim 16 wherein said second dividing bridge comprises a pair of resistors.

18. The differential stage of claim 17, wherein the transconductance of the auxiliary transistor is adjusted by a signal applied at the midpoint of the second dividing bridge.

19. A variable-gain amplifier including the differential stage of claim 5, further comprising means for modifying the gain by adjusting the current of the common current source.

20. A variable-gain amplifier including the differential stage of claim 5, further comprising means for modifying the gain by setting the common current source, and means for varying the transconductance of the auxiliary transistor conversely to the gain variation of the stage.

21. A variable gain amplifier comprising:

a differential stage including a pair of first transistors having respective output branches and controlled from a differential input voltage, a current source commonly connected to said pair of first transistors, and an auxiliary transistor controlled by the common mode of the differential input voltage and constructed and arranged to take from each of the output branches a portion of the current established by the common source;

a first dividing bridge connected between the output branches and wherein the auxiliary transistor is connected between the common current source and the midpoint of the first dividing bridge; and means for modifying the gain by adjusting the current of the common current source.

22. The differential stage of claim 13, wherein the additional transistor means has a higher transconductance than that of the first transistors.

23. The differential stage of claim 22, wherein the transconductance of the additional transistor means is selected so that a gain of the differential stage is kept when the differential input voltage exceeds a threshold where one of the first transistors turns off.

24. The differential stage of claim 23, wherein the transconductance of the additional transistor means is 5 to 6 time as high as that of the first transistors.

25. A variable gain amplifier comprising:

a differential stage including a pair of first transistors having respective output branches and controlled from a differential input voltage, a current source commonly connected to said pair of first transistors, and an auxiliary transistor controlled by the common mode of the differential input voltage and constructed and arranged to take from each of the output branches a portion of the current established by the common source;

a first dividing bridge connected between the output branches and wherein the auxiliary transistor is connected between the common current source and the midpoint of the first dividing bridge;

a first dividing bridge connected between the output branches and wherein the auxiliary transistor is connected between the common current source and the midpoint of the first dividing bridge; and means for modifying the gain by setting the common current source and means for varying the transconductance of the auxiliary transistor conversely to the gain variation of the stage.

26. The differential stage of claim 12 further including a second dividing bridge means across which the differential input voltage is applied, the additional transistor means being controlled from the midpoint of the second dividing bridge means.

27. The differential stage of claim 26, wherein the transconductance of the additional transistor means is adjusted by a signal applied at the midpoint of the second dividing bridge means.

28. A differential stage including two first transistors respectively controlled by two components of a differential input voltage, the two first transistors being connected to a common current source and forming two differential output branches, including an auxiliary transistor controlled by the common mode of the differential input voltage and connected between the common current source and the midpoint of a dividing bridge connected between the two output branches.

29. The differential stage of claim 28, wherein the auxiliary transistor has a higher transconductance than that of the first transistors.

30. The differential stage of claim 20, wherein the transconductance of the auxiliary transistor is selected so that a gain of the differential stage is kept when the differential input voltage exceeds a threshold where one of the first transistors turns off.

31. The differential stage of claim 30, wherein the transconductance of the auxiliary transistor is 5 to 6 times as high as that of the first transistor.

32. The differential stage of claim 28, wherein the auxiliary transistor is controlled by the midpoint of a second dividing bridge across which the differential input voltage is applied.

33. The differential stage of claim 32, wherein the transconductance of the auxiliary transistor is adjusted by a signal applied on the midpoint of the second dividing bridge.

34. A variable-gain amplifier including the differential stage of claim 31, and further comprising means for modifying the gain by adjusting the current of the common current source.

35. A variable-gain amplifier including the differential stage of claim 23, and further comprising means for modifying the gain by setting the common current source, and means for varying the transconductance of the auxiliary transistor conversely to the gain variation of the stage.

* * * * *